US007121841B2

(12) United States Patent
Alger et al.

(10) Patent No.: US 7,121,841 B2
(45) Date of Patent: Oct. 17, 2006

(54) ELECTRICAL SOCKET WITH COMPRESSIBLE DOMED CONTACTS

(75) Inventors: William O. Alger, Portland, OR (US); Gary B. Long, Aloha, OR (US); Gary A. Brist, Yamhill, OR (US); Jayne L. Mershon, Portland, OR (US); Michael W. Beckman, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/986,423

(22) Filed: Nov. 10, 2004

(65) Prior Publication Data

US 2006/0099835 A1 May 11, 2006

(51) Int. Cl.
*H01R 12/00* (2006.01)
*H05K 1/00* (2006.01)

(52) U.S. Cl. ........................................................ 439/71

(58) Field of Classification Search ............ 439/70–71, 439/66, 862, 74
See application file for complete search history.

(56) References Cited

U.S. PATENT DOCUMENTS 4,553,192 A * 11/1985 Babuka et al. .............. 361/743
5,092,783 A * 3/1992 Suarez et al. .................. 439/71
5,685,725 A * 11/1997 Uratsuji ........................ 439/71
5,702,255 A * 12/1997 Murphy et al. ............... 439/71

* cited by examiner

*Primary Examiner*—Javaid H. Nasri
(74) *Attorney, Agent, or Firm*—Robert G. Winkle

(57) ABSTRACT

A compressible domed contact used as a portion of socket contact within an electrical socket to eliminate co-planarity issues and to achieve an effective electrical connection between the electrical socket and a microelectronic device. The compressible domed contact may be made of resilient material such that it will substantially return to its original shape after being compressed.

18 Claims, 9 Drawing Sheets

ELECTRICAL SOCKET WITH COMPRESSIBLE DOMED CONTACTS

BACKGROUND OF THE INVENTION

1. Field of the Invention

Embodiments of the present invention relate to electrical sockets for electrically and physically connect microelectronic device(s) to a substrate. In particular, an embodiment of the present invention relates to compressible domed contacts within electrical sockets to achieve effective electrical connection between the electrical socket and the microelectronic device.

2. State of the Art

Electrical sockets may be used to secure microelectronic packages and/or integrated circuit devices, electrically and physically to a substrate, such as a system board, motherboard, or a printed circuit board, of an electronic system. These electrical sockets circuit devices, such as microprocessors, ASICs, and memory chips.

The microelectronic packages, which are used in conjunction with electrical sockets, are generally grid array packages. In a grid array package, the input/output elements placed on the surface of the microelectronic devices. The grid array packages have many advantages, including, but not limited to, simplicity, high contact density, and low inductance due to the short paths between the contact and the element within the microelectronic device. There are several types of grid arrays, including ball grid arrays, pin grid arrays, and land grid arrays. Ball grid arrays and chip scale packages having hemispherical solder balls as input/output elements. Pin grid arrays have pins, as input/output elements. Land grid arrays have flat pads as input/output elements.

An exemplary electrical socket 402 is shown in FIGS. 16 and 17 adjacent a first surface 404 of a substrate 406, wherein the electrical socket 402 is physically attached to and in electrical contact with the substrate 406 through a plurality of solder balls 408. The solder balls 408 extend between bond pads 412 on or in the substrate 406 and respective substrate ends 416 (see FIG. 17) of socket contacts 418 (generally by a metallization layer 414). The substrate bond pads 412 are connected through traces 422 (represented by dashed lines in FIG. 17) to other components (not shown). The socket contacts 418 extend through a socket interface portion 424 of the socket 402 and contact respective lands 426 on an active surface 428 of a microelectronic package 432. The microelectronic package 432 is generally biased toward the interface portion 424 by a variety of mechanisms, such as springs, clips, and the like (not shown), as will be understood to those skilled in the art. The electrical socket 402 may include sides 434 abutting the socket interface portion 424 to form a recess in which the microelectronic package 432 may reside.

As shown in FIG. 17, the socket contact 418 includes the socket contact substrate end 416 and an opposing package end 438. The socket contact 418 may include a resilient finger 442, which contacts, and preferably is biased against, the microelectronic package land 426. However, co-planarity problems with the microelectronic package land 426 (e.g., varying thicknesses thereof) can result in a "no connect" (shown within the dashed circle in FIG. 18), wherein the resilient finger 442 does not contact the microelectronic package land 426, or only making "light" contact with the microelectronic package land 426, which result in an "intermittent" connection. The only means to over come these co-planarity issues is to increase the force of the bias of the microelectronic package 432 against the resilient fingers 442. However, such increased bias can have detrimental affects on the microelectronic package 432, as will be understood by those skilled in the art.

Therefore, it would be advantageous to develop a socket contact which is capable of consistently forming an effective electrical contact with the lands or bumps of a microelectronic package regardless of co-planarity issues within tolerance limitations.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings to which:

DETAILED DESCRIPTION OF THE ILLUSTRATED EMBODIMENT

Figure 1:
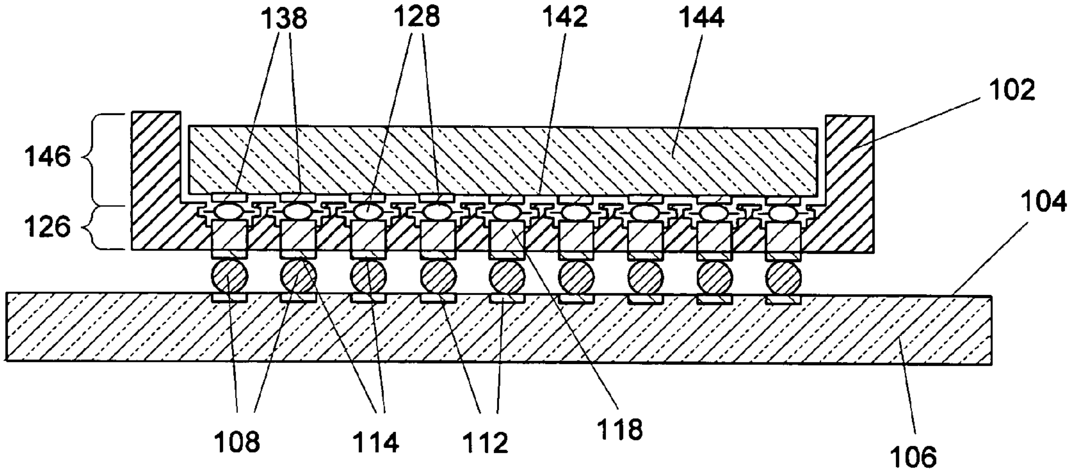
FIG. 1 is a side cross-sectional view of a socket attached to a substrate, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

An embodiment of the present invention comprises a compressible domed contact as a portion of a socket contact within an electrical socket to eliminate co-planarity issues and to achieve an effective electrical connection between the electrical socket and the microelectronic device.

Figure 2:
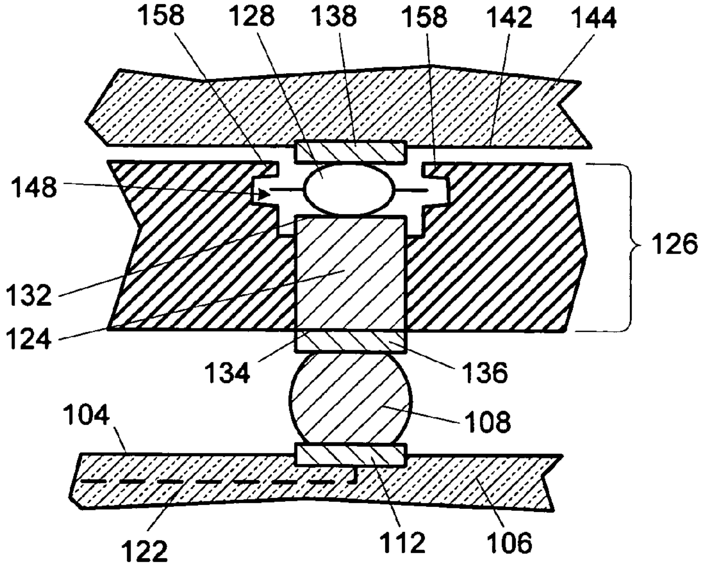
FIG. 2 is a side cross-sectional view of a socket contact, including a conductive element and a domed contact, extending through an interface portion of the socket of FIG. 1, according to the present invention.

FIGS. 1 and 2 illustrate an embodiment of an electrical socket 102 according to the present invention. The electrical socket 102 is adjacent a first surface 104 of a substrate 106, wherein the electrical socket 102 is physically attached to and in electrical contact with the substrate 106 through a plurality of solder balls 108. The solder balls 108 extend between bond pads 112 on or in the substrate first surface 104 and a second end 134 of a conductive element 124 of a socket contact 118. The substrate bond pads 112 may be connected through traces 122 (represented by dashed lines in FIG. 2) to external components (not shown).

The socket contacts 118 extend through an interface portion 126 of the electrical socket 102 and each comprise the conductive element 124 and a domed contact 128, as shown in FIG. 2. The conductive element 124 may be an insert or plug that serves as a contact point on its first end 132 for the domed contact 128, and as a contact point on its second end 134 for the attachment of the solder balls 108, generally with a metallization layer 136, as will be understood by those skilled in the art. The domed contact 128 contacts respective lands 138 on an active surface 142 of a microelectronic package 144. The microelectronic package 144 is generally biased toward the interface portion 126 by a variety of mechanisms (not shown), as will understood to those skilled in the art. The electrical socket 102 may include sides 146 abutting the socket to form a recess in which the microelectronic package 144 may reside.

Figure 3:
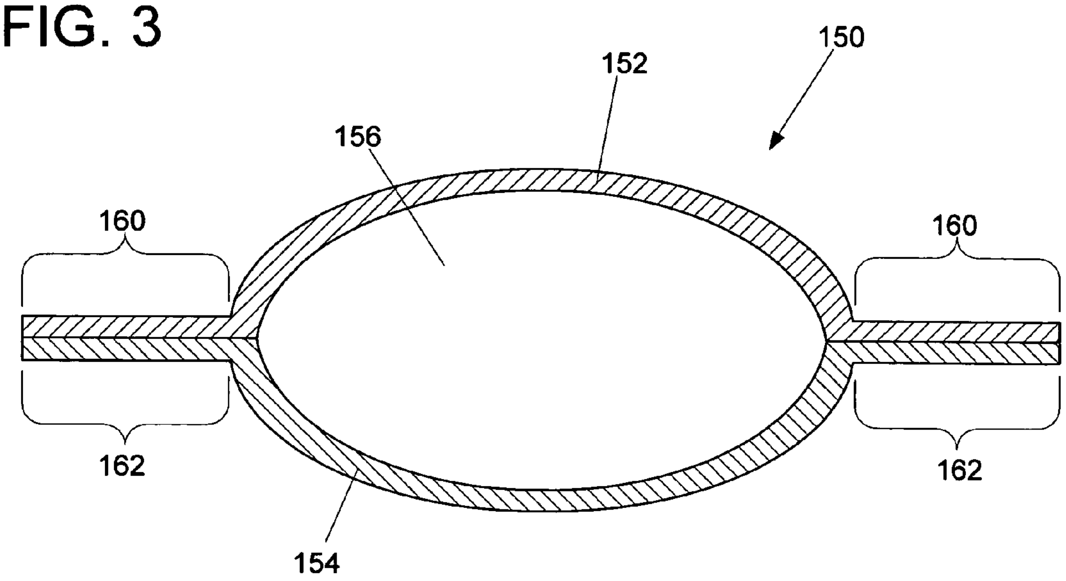
FIG. 3 is a side cross-sectional view of a dual domed contact comprising a first hemispherical contact and a second hemispherical contact, each having a flange, according to the present invention.
Figure 4:
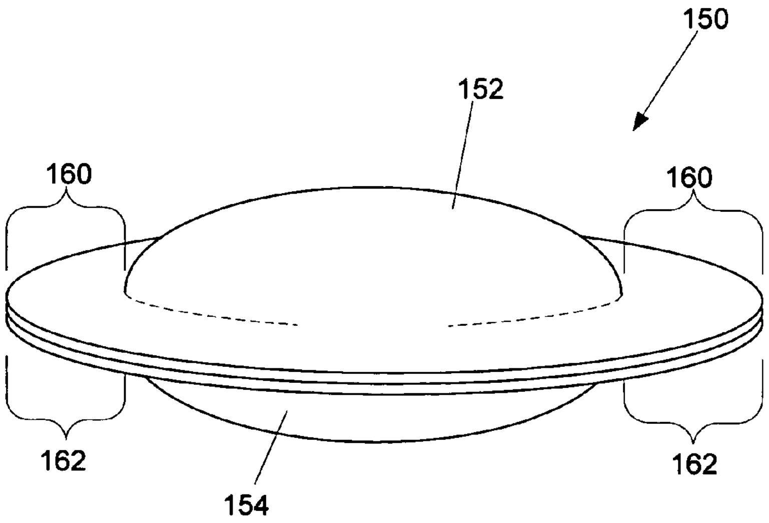
FIG. 4 is an oblique view of the dual domed contact of FIG. 3, according to the present invention.

As shown in FIGS. 3 and 4, the domed contact 128 may be a dual domed contact 150 comprising a first hemispherical contact 152 and an opposing, substantially similar, second hemispherical contact 154, such that a void 156 is formed therebetween. The first hemispherical contact 152 and the second hemispherical contact 154 can be made of any appropriate conductive material. However, in one embodiment, the first hemispherical contact 152 and/or the second hemispherical contact 154 may be made of a highly resilient conductive material, such as spring steel, beryllium, copper, alloys thereof, and the like, so the contacts will deform under compression and return to their original shape when the not under compression.

In one embodiment, the domed contact 128 resides in a recess 148 in the socket interface portion 126. The socket interface portion 126 may have a retaining flange 158, which keeps the domed contact 128 within the recess 148, while allowing the domed contact 128 to move freely in the recess 148.

It is, of course, understood that the first hemispherical contact 152 and/or the second hemispherical contact 154 need not be perfectly hemispherical, and may have any appropriate domed shape. The first hemispherical contact 152 and the second hemispherical contact may each include a flange 160 and 162, respectively, which extends outwardly and radially therefrom. When placed in contact with one another, the first hemispherical contact flange 160 and the second hemispherical contact flange 162 may be co-planar to one another and may be attached together by a conductive adhesive, welding, soldering, or the like (not shown). Naturally, the surface area of the first hemispherical contact flange 160 and the second hemispherical contact flange 162 allows for a robust attachment surface therebetween. Although the each flange 160 and 162 is illustrated as completely surrounding the periphery thereof, it need not, as one skilled in the art will understand, as it could also include a series of tabs and the like.

Figure 5:
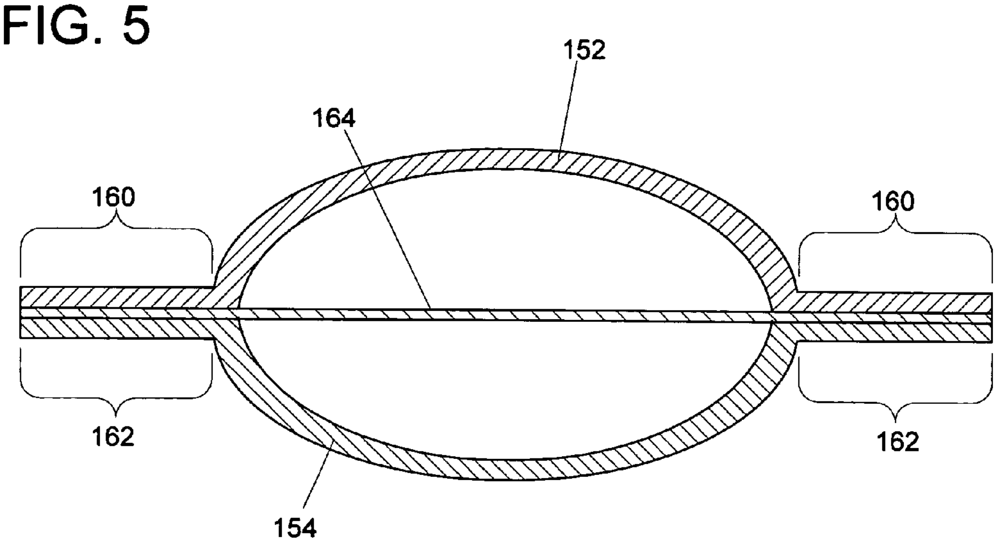
FIG. 5 is a side cross-sectional view of a dual domed contact having a resilient layer between a first hemispherical contact and a second hemispherical contact, according to the present invention.

As shown in FIG. 5, a resilient sheet 164, preferably highly conductive, may be laminated between the first hemispherical contact 152 and the second hemispherical contact 154 to assist the first hemispherical contact 152 and the second hemispherical contact 154 return to substantially their original shape after deformation. This will allow for the use of a less resilient conductive material to be used in the fabrication of the first hemispherical contact 152 and/or the second hemispherical contact 154. The resilient sheet 164 may comprise spring steel, beryllium, copper, alloys thereof, and the like.

Figure 6:
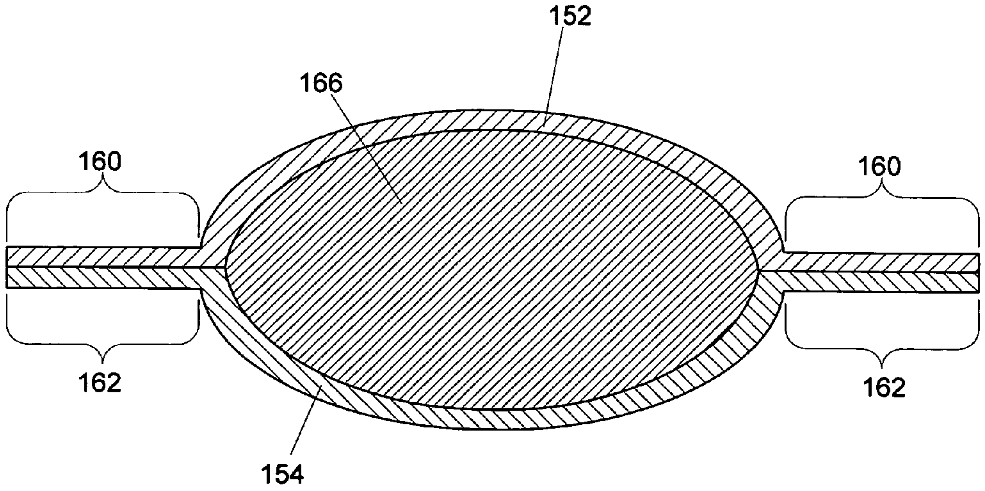
FIG. 6 is a side cross-sectional view of a dual domed contact having a resilient conductive material in a void between a first hemispherical contact and a second hemispherical contact, according, according to the present invention.

It is understood that the void 156 may be filled with a deformable, conductive material (shown in FIG. 6) in order to limit the total amount of compression and increase the cross sectional area of the conductive path, as will be understood to those skilled in the art. The deformable, conductive material may include, but is not limited to, metal-filled elastomer, strand/fibrous conductive material (such as steel wool), and the like.

Figure 7:
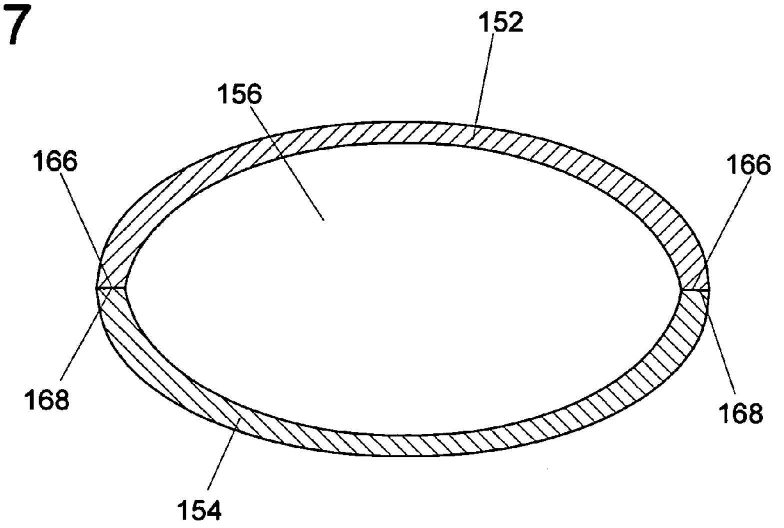
FIG. 7 is a side cross-sectional view of a dual domed contact without flanges, according, according to the present invention.

It is further understood, the first hemispherical contact flanges 160 and second hemispherical contact 162 shown in FIGS. 3 and 4 are optional. As shown in FIG. 7, opposing edges 166 and 168 of the first hemispherical contact 152 and the second hemispherical contact 154, respectively, may be directly attached to one other by a conductive adhesive, welding, soldering, or the like.

Figure 8:
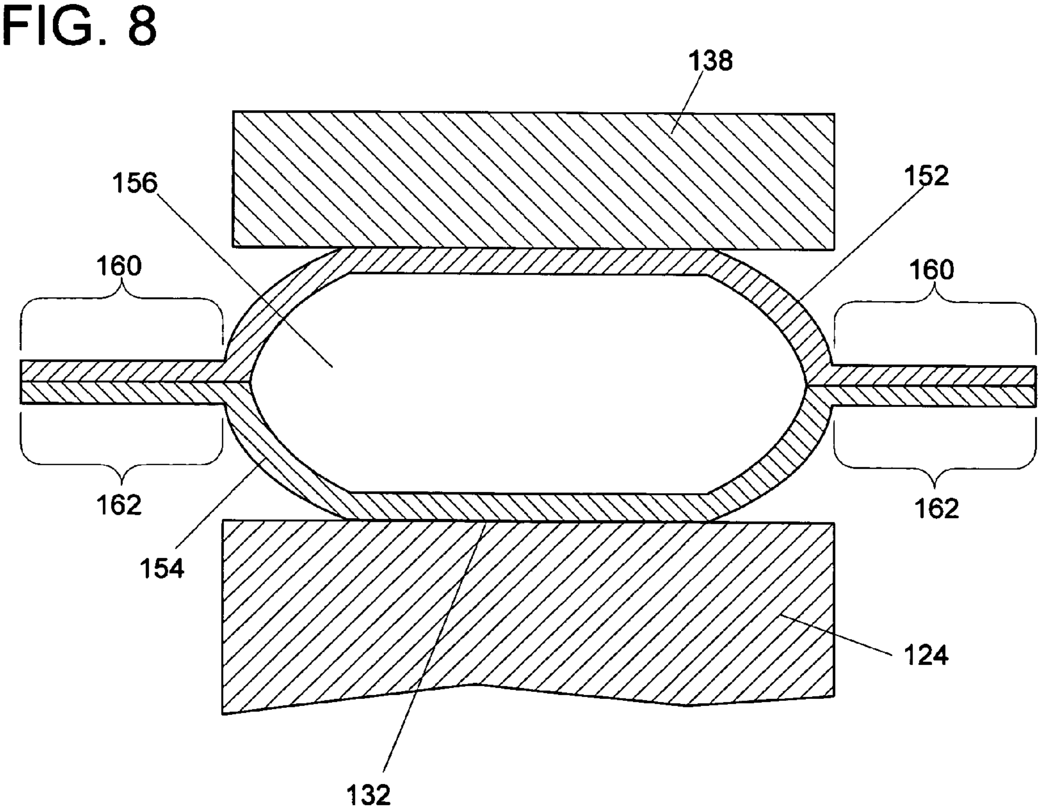
FIG. 8 is a side cross-sectional view of a dual domed contact under a compression, according, according to the present invention.
Figure 9:
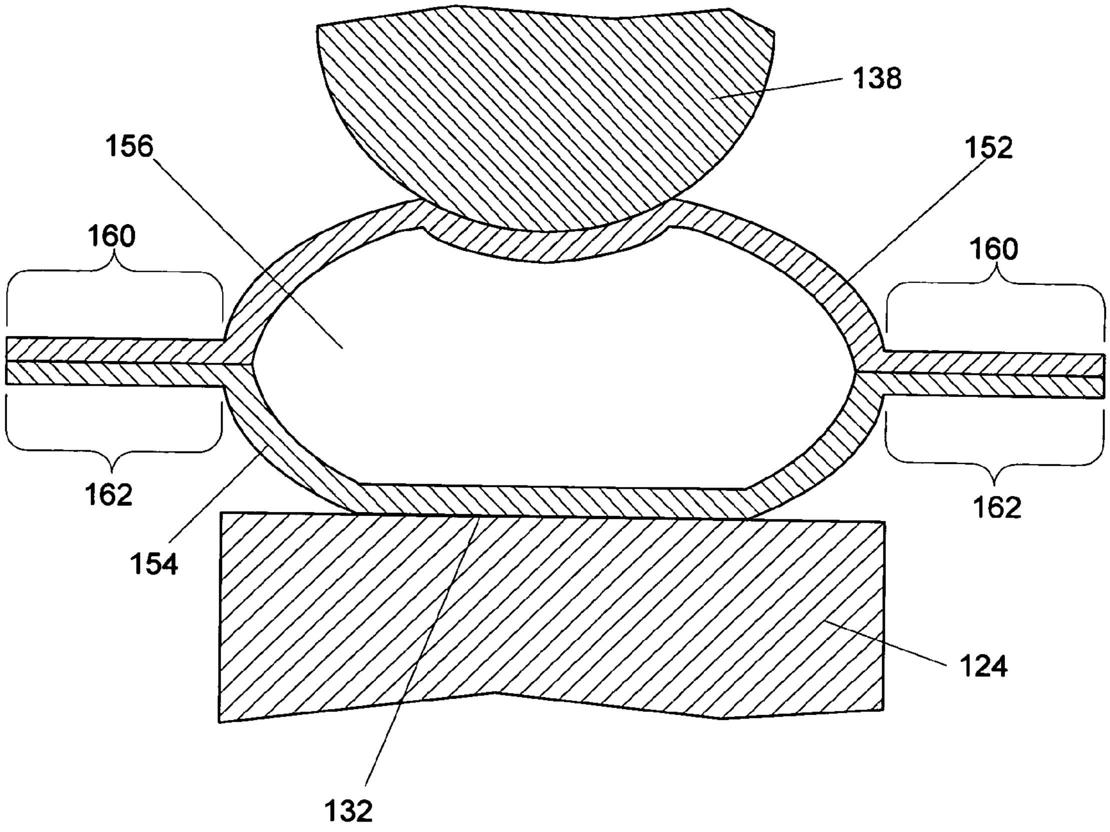
FIG. 9 is a side cross-sectional view of a dual domed contact under a compression, wherein the microelectronic package land is substantially hemispherical, according to the present invention.

The thickness of the first hemispherical contact 152 and the second hemispherical contact 154 may be selected such that, when the microelectronic package land 138 is biased against the domed contact 128, the first hemispherical contact 152 deforms to substantially conform to the shape of the microelectronic package land 138 and the second hemispherical contact 154 deforms to substantially conform to the shape of the conductive element first end 132, as shown in FIG. 8. This deformation increases the surface area contact, which improves the resistance and inductance of the electrical path, as will be understood to those skilled in the art. It is, of course, understood that the microelectronic package land 138 can be a variety of shapes, including, but not limited to, domed or hemispherical, as shown in FIG. 9. Thus, a ball grid array may also be used with the present invention. Furthermore, as previously discussed, the dome of the first hemispherical contact 152 and/or the dome of the second hemispherical contact 154 need not be perfectly hemispherical, but can be designed to increase their contact area with the shape of the microelectronic package land 138 and/or the conductive element first end 132.

As previously discussed, in one embodiment, the domed contact 128 moves freely in the recess 148 (see FIG. 2). This allows the domed contact 128 to self-center between the conductive element first end 132 and the microelectronic package land 138 during compression. This reduces the amount of compression force need to established full electrical contact between the microelectronic package land 138 and the conductive element first end 132.

Figure 10:
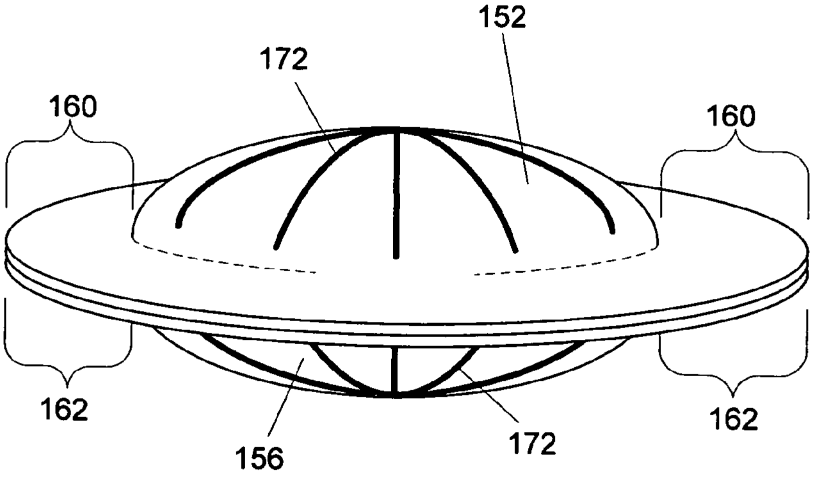
FIG. 10 is an oblique view of a dual domed contact having a star burst aperture for stress reduction, according to the present invention.
Figure 11:
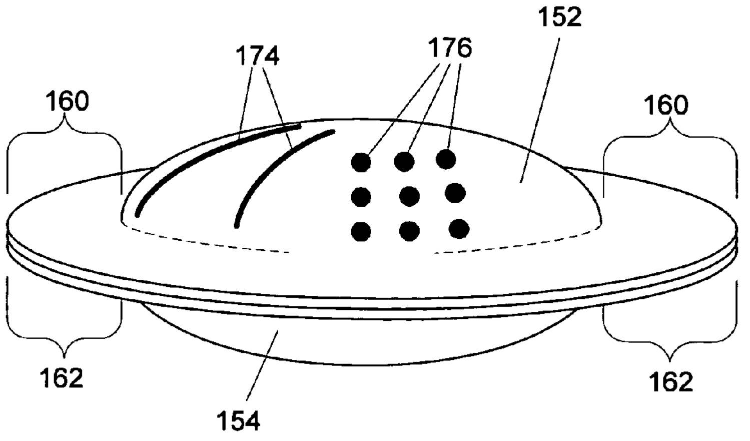
FIG. 11 is an oblique view of a dual domed contact having slots and holes as stress reduction apertures therein, according to the present invention.

In order to reduce the stress on either the first hemispherical contact 152 or the second hemispherical contact 154 during the compression, apertures can be formed in either or both. An aperture 172 may be as complex as slotted star burst pattern, as shown in FIG. 10, or simple slots 174 and/or holes 176, as shown in FIG. 11. Reducing the stresses on either the first hemispherical contact 152 or the second hemispherical contact 154 reduces the chance of material fatigue and potential contact failure from continuous compression and/or repeated compression and decompression. The stress reduction aperture designs are, of course, dependent on the material used and the application needs.

Figure 12:
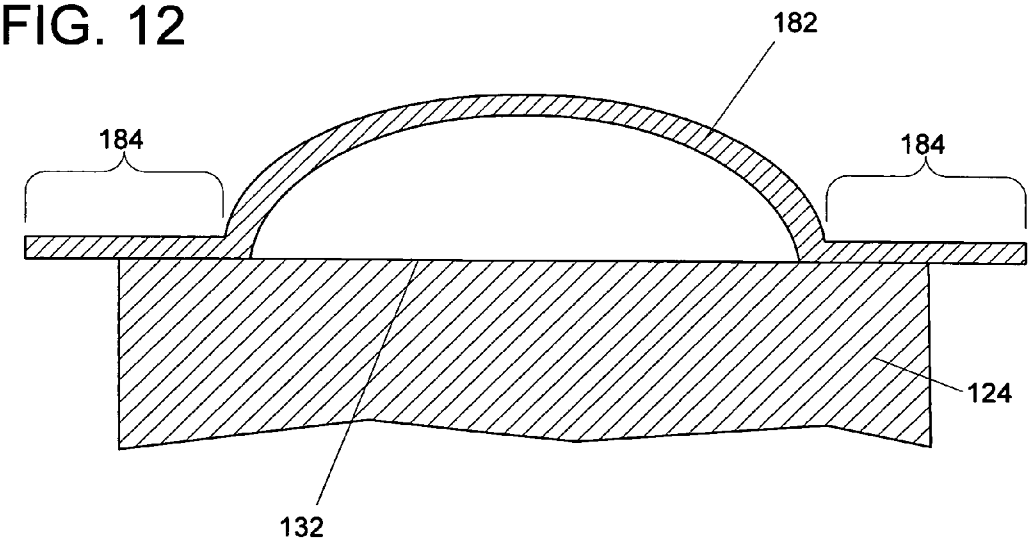
FIG. 12 is a side cross-sectional view of a single domed contact, according to the present invention.

Another embodiment of a domed contact is illustrated in FIG. 12. The domed contact 126 may be a single hemispherical contact 182. The single hemispherical contact 182 may also have a flange 184 extending externally and radially which contacts the conductive element first end 132. The single hemispherical contact 182 may also include a conductive resilient sheet, such as shown in FIG. 5 as element 154, laminated to the single hemispherical contact 182 to assist the single hemispherical contact 182 return to substantially its original shape after deformation. Of course, if the single hemispherical contact 182 is sufficiently resilient, then the conductive resilient sheet is not necessary.

Figure 13:
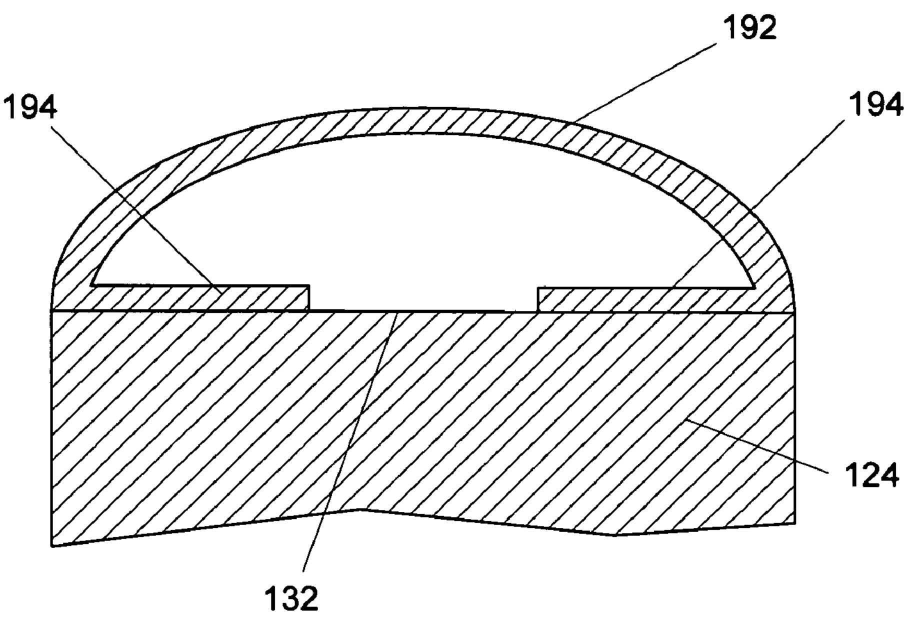
FIG. 13 is a side cross-sectional view of a single domed contact having an inwardly extending flange, according to the present invention.

In yet another embodiment, as illustrated in FIG. 13, a domed contact may be a single hemispherical contact 192 having a flange 194 that extends inward and is shaped to substantially conform to the conductive element first end 132. Furthermore, a dual domed contact may be also be formed by attaching two single hemispherical contacts 192 using the flanges 194 as connection surfaces.

Figure 14:
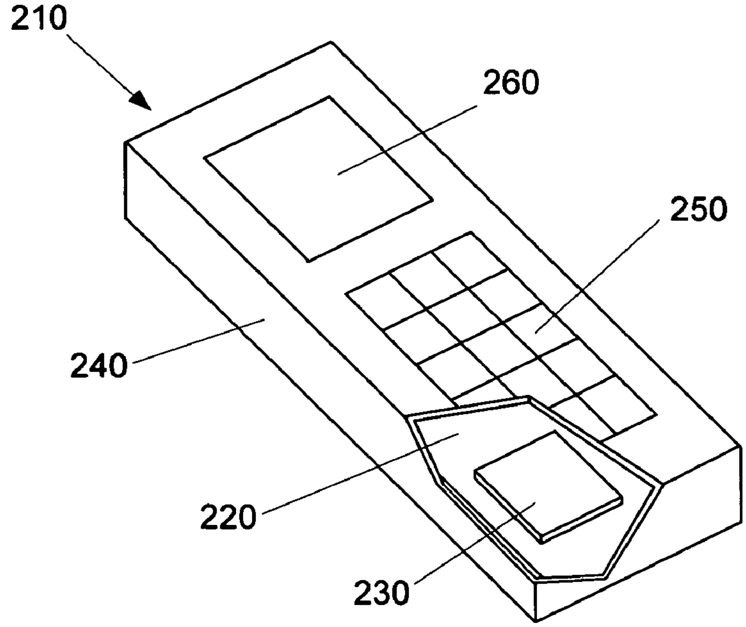
FIG. 14 is an oblique view of an electronic device having a socket of the present invention integrated therein, according to the present invention.

The packages formed by the present invention may be used in a hand-held device 210, such as a cell phone or a personal data assistant (PDA), as shown in FIG. 14. The hand-held device 210 may comprise an external substrate 220 with at least one microelectronic device assembly 230, including but not limited to, a central processing units (CPUs), chipsets, memory devices, ASICs, and the like, having at least one socket having at least one domed contact 128 (150, 182, 192) as described above, within a housing 240. The external substrate 220 may be attached to various peripheral devices including an input device, such as keypad 250, and a display device, such an LCD display 260.

Figure 15:
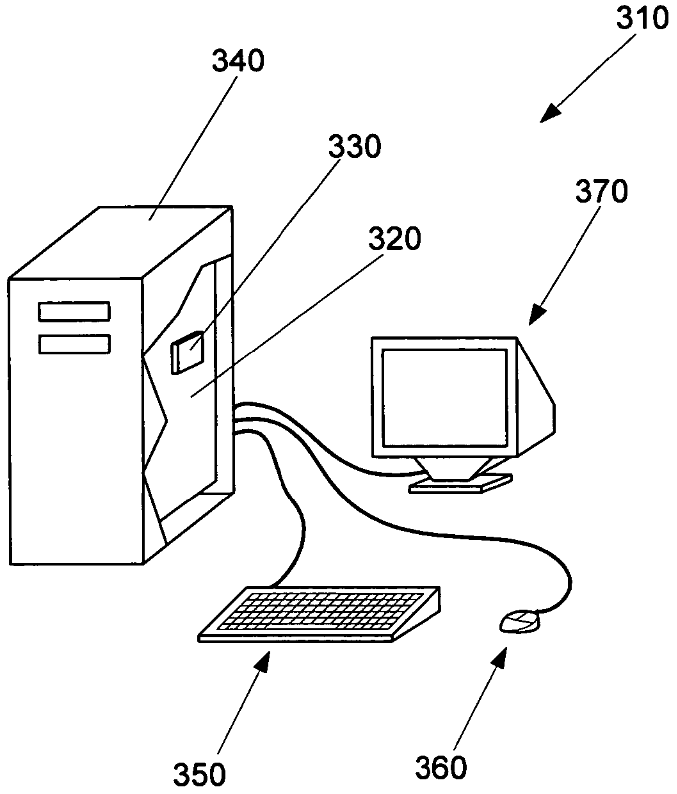
FIG. 15 is an oblique view of a computer system having a microelectronic assembly of the present integrated therein, according to the present invention.
Figure 16:
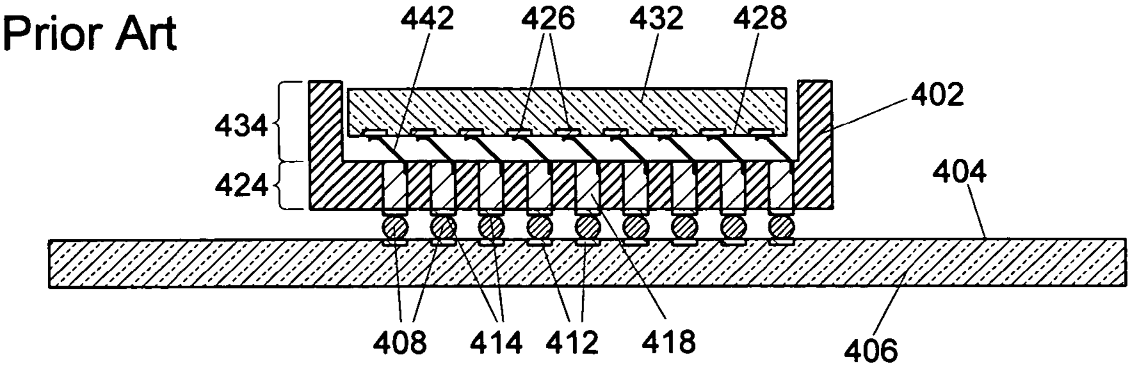
FIG. 16 Prior Art
FIG. 16 is a side cross-sectional view of a socket having a microelectronic device therein, as known in the art.
Figure 17:
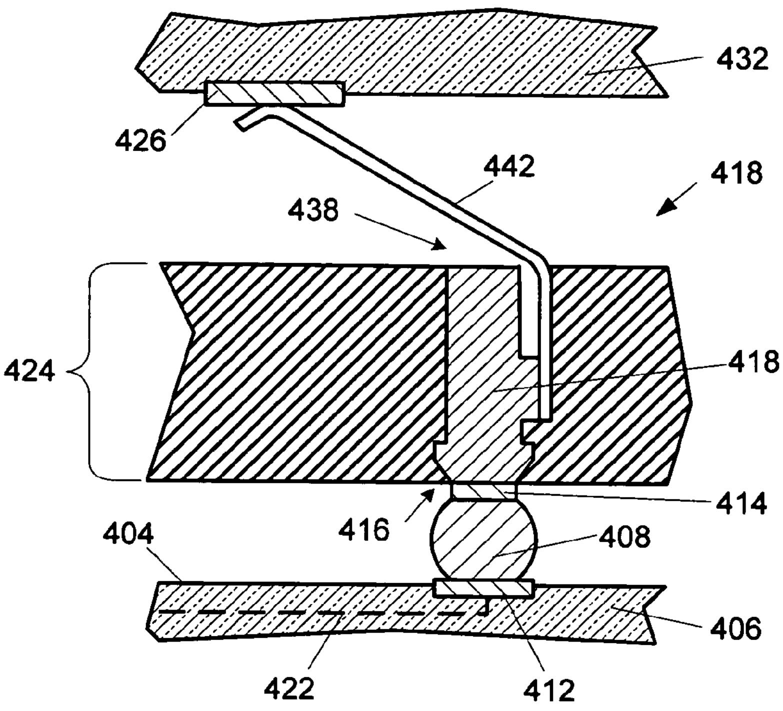
FIG. 17 Prior Art
FIG. 17 is a side cross-sectional view of a socket contact, as known in the art.
Figure 18:
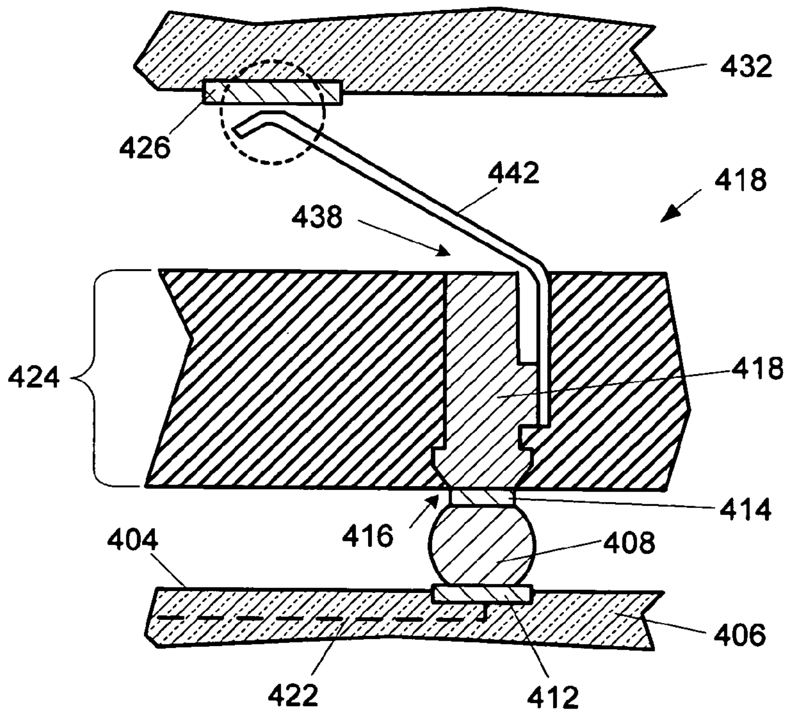
FIG. 18 Prior Art
FIG. 18 is a side cross-sectional view of a socket contact which is in a "no contact" condition, as known in the art.

The microelectronic device assemblies formed by the present invention may also be used in a computer system 310, as shown in FIG. 15. The computer system 310 may comprise an external substrate or motherboard 320 with at least one microelectronic device assembly 330, including but not limited to, a central processing units (CPUs), chipsets, memory devices, ASICs, and the like, having at least one socket having at least one domed contact 128 (150, 182, 192) as described above, within a housing or chassis 340. The external substrate or motherboard 320 may be attached to various peripheral devices including inputs devices, such as a keyboard 350 and/or a mouse 360, and a display device, such as a CRT monitor 370.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A socket, comprising:

an interface portion;

at least one contact extending through said interface portion, wherein said contact includes a conductive element and a domed contact, wherein said domed contact comprises a first hemispherical contact and a second hemispherical contact, wherein said first hemispherical contact and said second hemispherical contact are attached to one another such that at least one combined void is defined therebetween; and a conductive resilient material is dispersed within said combined void.

2. The socket of claim 1, wherein said conductive resilient material comprises a metal filled elastomer.

3. The socket of claim 1 wherein said conductive resilient material comprises a fibrous material.

4. The socket of claim 1, wherein at least one of said first hemispherical contact and said second hemispherical contact includes a flange.

5. The socket of claim 4, wherein each of said first hemispherical contact and said second hemispherical contact include at least one flange and wherein at least said first hemispherical contact flange and at least one said second hemispherical contact flange are attached to one another.

6. The socket of claim 1, wherein at least one of said first hemispherical contact and said second hemispherical contact includes a flange.

7. The socket of claim 6, wherein each of said first hemispherical contact and said second hemispherical contact include at least one flange and wherein at least said first hemispherical contact flange and at least one said second hemispherical contact flange are attached to one another.

8. A socket, comprising:

an interface portion;

at least one contact extending through said interface portion, wherein said contact includes a conductive element and a domed contact, wherein said domed contact comprises a first hemispherical contact and a second hemispherical contact, wherein said first hemispherical contact and said second hemispherical contact are attached to one another such that at least one combined void is defined therebetween; and at least one resilient sheet laminated between said first hemispherical contact and said second hemispherical contact.

9. A microelectronic assembly, comprising:

a socket having an interface portion;

a microelectronic package having at least one land on an active surface thereof positioned proximate said socket interface portion;

at least one socket contact extending through said interface portion; wherein said contact includes a conductive element and a domed contact, wherein said domed contact of socket contact abut said at least one microelectronic package land and abut a first surface of said conductive element to provide an electrical path therebetween, wherein said domed contact comprises a first hemispherical contact and a second hemispherical contact, wherein said first hemispherical contact and said second hemispherical contact are attached to one another such that at least one combined void is defined therebetween; and a conductive resilient material is dispersed within said void.

10. The microelectronic assembly of claim 9, further including a solder ball in electric contact with a second surface of said socket contact conductive element.

11. The microelectronic assembly of claim 9 wherein said conductive resilient material comprises a metal filled elastomer.

12. The microelectronic assembly of claim 9 wherein said conductive resilient material comprises a fibrous material.

13. The microelectronic assembly of claim 9 further comprising at least one resilient sheet laminated between said first hemispherical contact and said second hemispherical contact.

14. The microelectronic assembly of claim 9 wherein at least one of said first hemispherical contact and said second hemispherical contact includes a flange.

15. The microelectronic assembly of claim 14, wherein each of said first hemispherical contact and said second hemispherical contact include at least one flange and wherein at least said first hemispherical contact flange and at least one said second hemispherical contact flange are attached to one another.

16. An electronic system, comprising:

a substrate within a housing;

at least one microelectronic device package attached to said substrate by a socket, wherein said socket comprises:

an interface portion;

at least one contact extending through said interface portion, wherein said contact includes a conductive element and a domed contact, wherein said domed contact comprises a first hemispherical contact and a second hemispherical contact, wherein said first hemispherical contact and said second hemispherical contact are attached to one another such that at least one combined void is defined therebetween; and a conductive resilient material is dispersed within said combined void.

17. The electronic system of claim 16 wherein at least one of said first hemispherical contact and said second hemispherical contact includes a flange.

18. The electronic system of claim 17, wherein each of said first hemispherical contact and said second hemispherical contact include at least one flange and wherein at least said first hemispherical contact flange and at least one said second hemispherical contact flange are attached to one another.

* * * * *